(12) United States Patent
Holt et al.

(10) Patent No.: US 9,411,684 B2
(45) Date of Patent: Aug. 9, 2016

(54) LOW DENSITY PARITY CHECK CIRCUIT

(71) Applicant: Micron Technology, Inc., Boise, ID (US)

(72) Inventors: Joe F. Holt, Northglenn, CO (US);
Suresh Rajgopal, San Diego, CA (US);
Jacob B. Derouen, Thornton, CO (US);
Benjamin G. Hess, Loveland, CO (US)

(73) Assignee: Micron Technology, Inc., Boise, ID (US)

( * ) Notice: Subject to any disclaimer, the term of this patent is extended or adjusted under 35 U.S.C. 154(b) by 123 days.

(21) Appl. No.: 14/218,315

(22) Filed: Mar. 18, 2014

(65) Prior Publication Data

US 2015/0270851 A1   Sep. 24, 2015

(51) Int. Cl.
*G11C 29/00* (2006.01)
*G06F 11/10* (2006.01)
*H03M 13/11* (2006.01)
*H03M 13/00* (2006.01)

(52) U.S. Cl.
CPC ....... *G06F 11/1076* (2013.01); *H03M 13/1105* (2013.01); *H03M 13/6505* (2013.01)

(58) Field of Classification Search
CPC ................. H03M 13/1102; G06F 11/1076
See application file for complete search history.

(56) References Cited

U.S. PATENT DOCUMENTS

| 2004/0034828 A1* | 2/2004 | Hocevar | H03M 13/1114 714/800 |
| 2005/0204262 A1* | 9/2005 | Berens | H03M 13/6566 714/755 |
| 2010/0293212 A1* | 11/2010 | Paumier | G11C 19/287 708/209 |

* cited by examiner

*Primary Examiner* — Sam Rizk
(74) *Attorney, Agent, or Firm* — Schwegman Lundberg & Woessner, P.A.

(57) ABSTRACT

Generally discussed herein are Low Density Parity Check (LDPC) circuit layouts. An example LDPC circuit can include combinational logic and a plurality of memory units. Each of the plurality of memory units can be electrically coupled to each other and the combinational logic, and the plurality of memory units can be situated in a ring-like configuration.

9 Claims, 5 Drawing Sheets

LOW DENSITY PARITY CHECK CIRCUIT

BACKGROUND

Low Density Parity Check (LDPC) was developed around 1960 by Robert G. Gallager at the Massachusetts Institute of Technology. The LDPC is a linear error correcting code. LDPCs are often used for transmitting signals over noisy transmission mediums. LDPC codes are linear codes obtained from a sparse bipartite graph of message and check nodes. The LDPC code of a matrix representation of the graph can be found by finding a set of vectors, that when multiplied by the matrix, yield a zero matrix.

DETAILED DESCRIPTION

Low Density Parity Check (LDPC) circuit designs are computationally complex designs that often include combinational logic cells coupled to memory units (e.g., Random Access Memory (RAM) units). LDPC circuit designs have an inherent read time latency that can make implementing them in a Solid State Drive (SSD) (e.g., an SSD controller) or other storage device difficult. The LDPC circuit can be too slow to maintain pace with a memory clock speed due to the inherent latencies of the LDPC circuit. These inherent latencies can be prevalent on a System on Chip (SoC) Integrated Circuit (IC) where space, clock time/speed, and efficiency can be important considerations.

A circuit coupled to the LDPC can benefit from an LDPC circuit the reads, processes, and stores data relatively fast (e.g., at faster than one hundred megahertz). In one or more clock cycles, data (e.g., a number of bits, such as four to eight bits or more that comprise an LDPC code) can be read from the memory units, processed by combinational logic of the LDPC, and then sent back to the memory units (e.g., all the memory units), such as for storage or computational accuracy.

Figure 1:
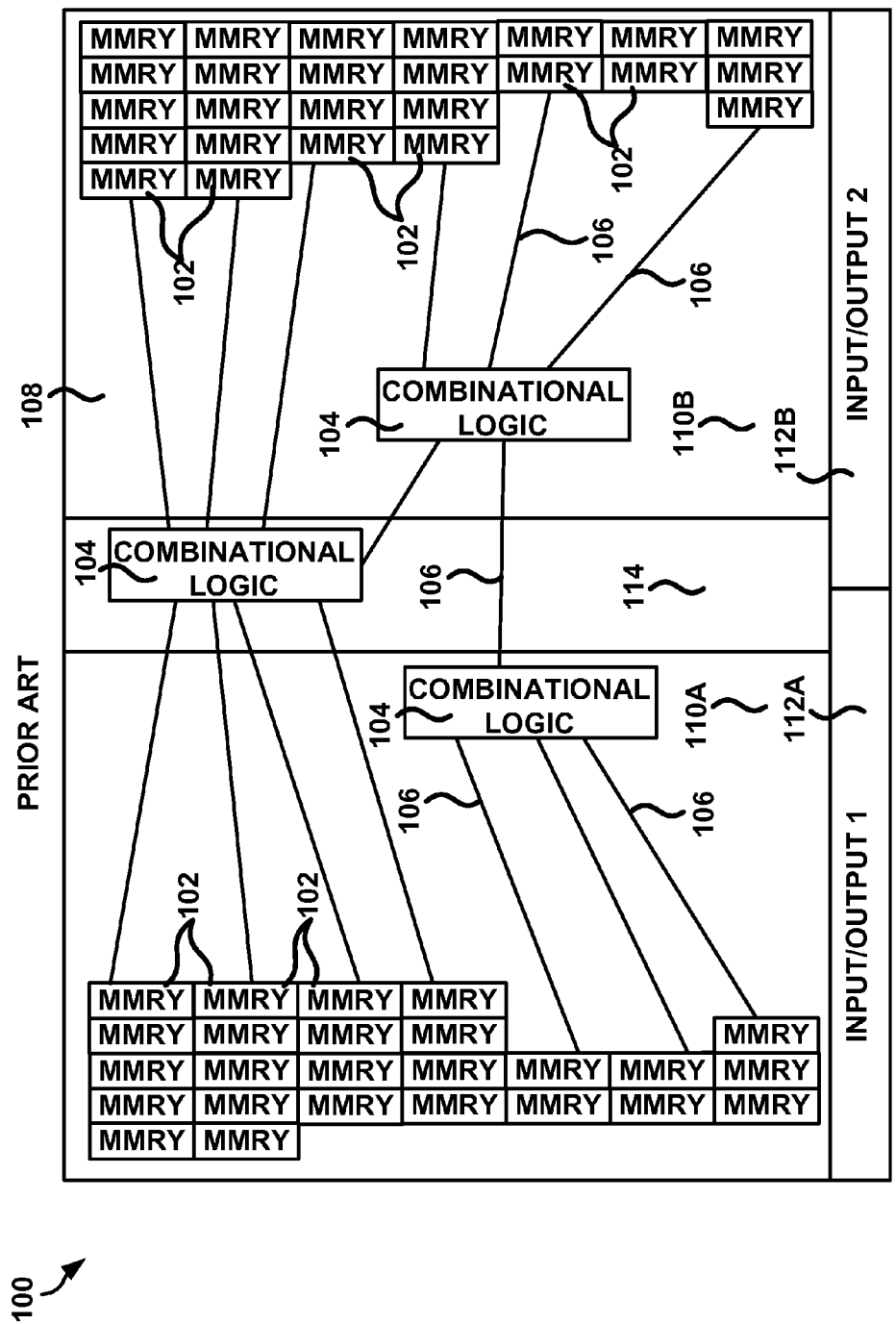
FIG. 1 shows a block diagram of a prior art Low Density Parity Check (LDPC) circuit.

FIG. 1 shows a block diagram of an example of a prior art LDPC circuit 100 in a package 108. The LDPC circuit 100 can include a plurality of memory units 102, combinational logic 104, one or more write channels 110A or 110B, Input or Output (I/O) circuitry 112A or 112B, or a read channel 114. The circuit 100 can include interconnects 106 configured to electrically couple the memory units 102, the combinational logic 104, write channel 110A-B, I/O circuitry 112A-B, or read channel 114 to one another. The interconnects 106 can electrically couple combinational logic 104 to other combinational logic 104 or can electrically couple a memory unit 102 to another memory unit 102. Examples of interconnects can include traces, such as traces on or at least partially in a Printed Circuit Board (PCB) or a semiconductor substrate, or other conductive paths capable of carrying an electrical signal from one circuit element (e.g., combinational logic 104, write channel 110A-B, read channel 114, or memory unit 102, etc.) to another. The length of the interconnects 106 can create latencies that put an effective ceiling on a clock speed (e.g., frequency) at which the circuit 100 can be operated.

The circuit 100 can include the memory units 102 situated along the edge, near the periphery, or away from the center of the package 108. The combinational logic 104 can be situated principally between memory units 102 situated on opposite sides of the package 108. The package 108 can be an encasing at least partially surrounding the elements of the circuit 100 or can be a substrate to which the elements of the circuit 100 can be electrically or mechanically coupled.

Figure 2:
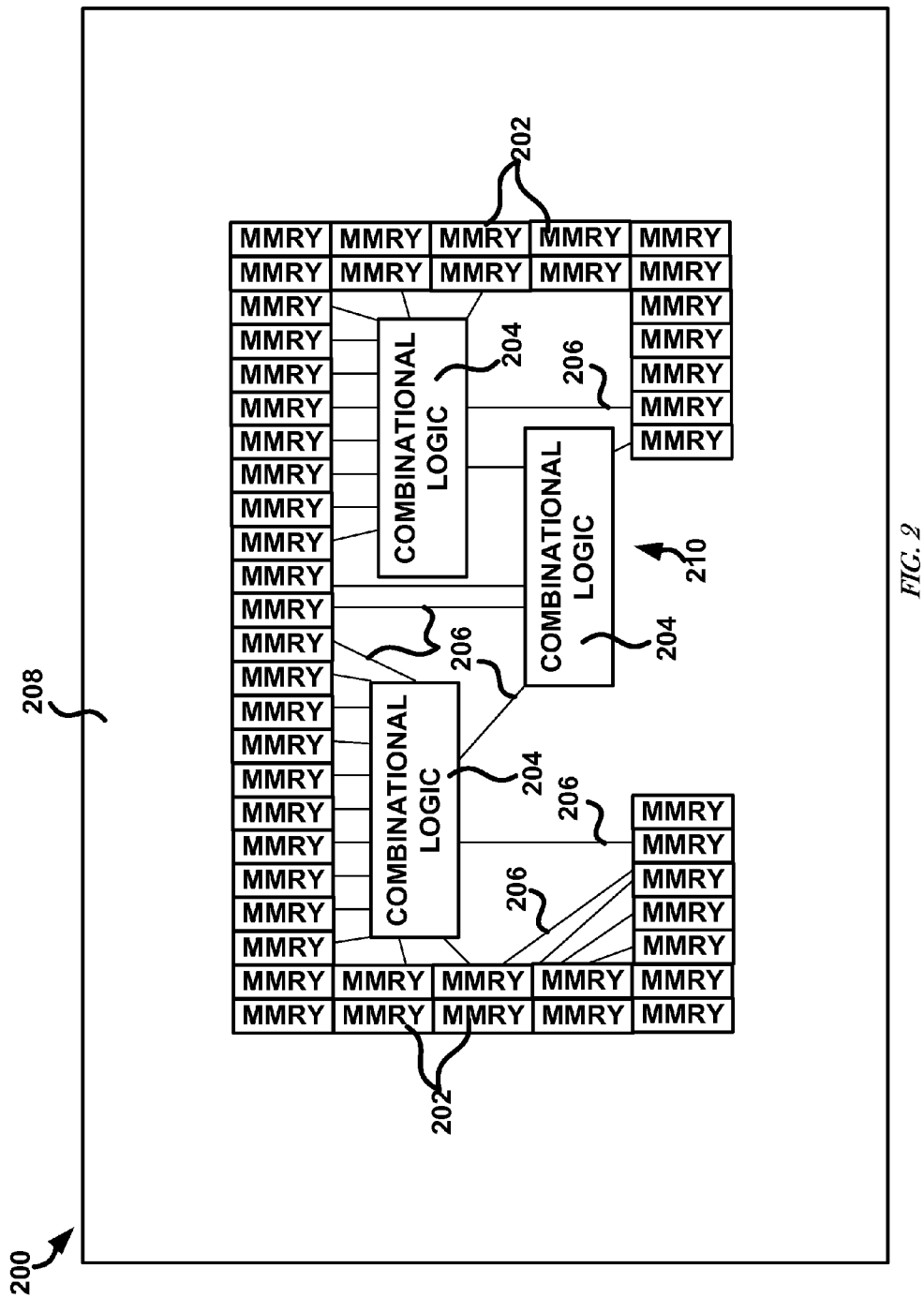
FIG. 2 shows a block diagram of another example of a Low Density Parity Check (LDPC) circuit.

FIG. 2 shows a circuit 200 that can operate using a faster clock rate than the LDPC circuit 100. The circuit 200 can include similar components as the circuit 100, with the layout of the circuit 200 including the memory units 202 situated in a ring-like configuration (e.g., ring, open ring, doughnut, annulus, open-annulus, or other ring-like configuration). The ring-like configuration of memory units 202 can be situated generally central to (e.g., away from the edges of) the package 208. The combinational logic 204 can be situated at least partially within an inner area 210 of the ring-like configuration of memory units 202, such as shown in FIG. 2. Some of the combinational logic 204 can be situated outside the area defined by the ring-like configuration of memory units 202 (such a configuration is not shown in FIG. 2). The combinational logic can be situated primarily within the inner area 210 of the ring-like configuration of memory units 202.

The memory units 202 can be volatile or nonvolatile memory. Examples of volatile memory include Random Access Memory (RAM), Dynamic RAM (DRAM), Static RAM (SRAM), and Synchronous Dynamic RAM (SDRAM), among others. Examples of nonvolatile memory include Read Only Memory (ROM), holographic memory, Magnetoresistive RAM (MRAM), flash memory, other types of nonvolatile RAM (NVRAM), and magnetic computer storage devices, among others. One or more of the memory units 202 can be the same or a different make and model than another memory unit.

The combinational logic 204 can include logic gates, such as "AND" or "OR" gates or the negated versions of these gates, multiplexers, demultiplexers, adders, subtractors, encoders, decoders or other combinational logic circuitry. The combinational logic 204 can include elements that produce an output that is a function of the present input only. That is, for each input value, the output of the combinational logic 204 is always the same. For example, if the combinational logic 204 outputs the value "1010" for an input "0000", then every time the input is "0000" the output will be "1010" shortly after the input value becomes "0000". The combinational logic 204 can operate without the use of a clock or oscillator. This is in contrast to sequential logic, which can include an output that is dependent on a previous input, output, or other value. Sequential logic typically operates by performing logic operations at the rising or falling edge of a clock or oscillator that is coupled to the sequential logic.

The circuit 200 can include interconnects 206 configured to electrically couple the memory units 202, the combinational logic 204, write channel 308A-B, I/O circuitry 312A-B, or read channel 310 to one another. The interconnects 206 can electrically couple combinational logic 204 to other combinational logic 104 or can electrically couple a memory unit 202 to another memory unit 202. Each memory unit 202 of the circuit 200 can be coupled to all the other memory units 202 of the circuit 200, such as through the interconnects 206.

By situating the memory units 202 in a ring-like configuration or situating the combinational logic 204 at least partially within the ring-like configuration, the length of the interconnects 206 electrically coupling the memory units 202 and the combinational logic 204 can be reduced. With the length of the interconnects 206 reduced, the time it takes for a signal to travel along the interconnect 206 can be reduced (as compared to the circuit 100 in FIG. 1) and the frequency at which the LDPC circuit 200 can reliably operate can be increased. Increasing the frequency can increase the throughput of the LPDC circuit 200. Also, using a ring-like configuration of memory units 202 can reduce the area that the LDPC circuit 200 layout requires so as to lower production costs or increase the number of LPDC circuits 200 that can be manufactured on a wafer. Using a ring-like configuration of memory units 102 can increase the power efficiency of the LDPC circuit 200. The power efficiency increase can be from the LDPC circuit consuming less area, a reduced number of logic cells (e.g., gates) in the combinational logic 204, or reduced routing as compared to non-ring-like configurations of memory units, such as in the circuit 100.

A trade off can be made between how many memory units 202 are used and how fast the LDPC circuit 200 can operate. A few larger, slower memory units can be used, or more, smaller, and faster memory units can be used. When more, smaller memory units 202 are used, the interconnect 206 layout between the memory units 202, the combinational logic 204, and other circuit 200 elements can become more complicated. This routing can determine the maximum frequency at which the LDPC circuit 200 can be operated (e.g., reliably run, or the maximum frequency of a clock 314 (see FIG. 3) that can be used to clock the LDPC circuit 200).

In an example, by using a ring-like memory unit 202 layout the average interconnect 206 length can be reduced by about 7.66 percent as compared with the interconnect 106 length of the circuit 100 shown in FIG. 1. The longest interconnect 206 length (e.g., critical path) can also be substantially reduced by using a ring-like configuration of memory units 202 in an LDPC circuit 200, such as shown in FIG. 2, thus allowing the LDPC circuit to be operated at a higher frequency (e.g., by increasing the frequency of the clock 314 (e.g., oscillator) coupled to the circuit 200).

Figure 3:
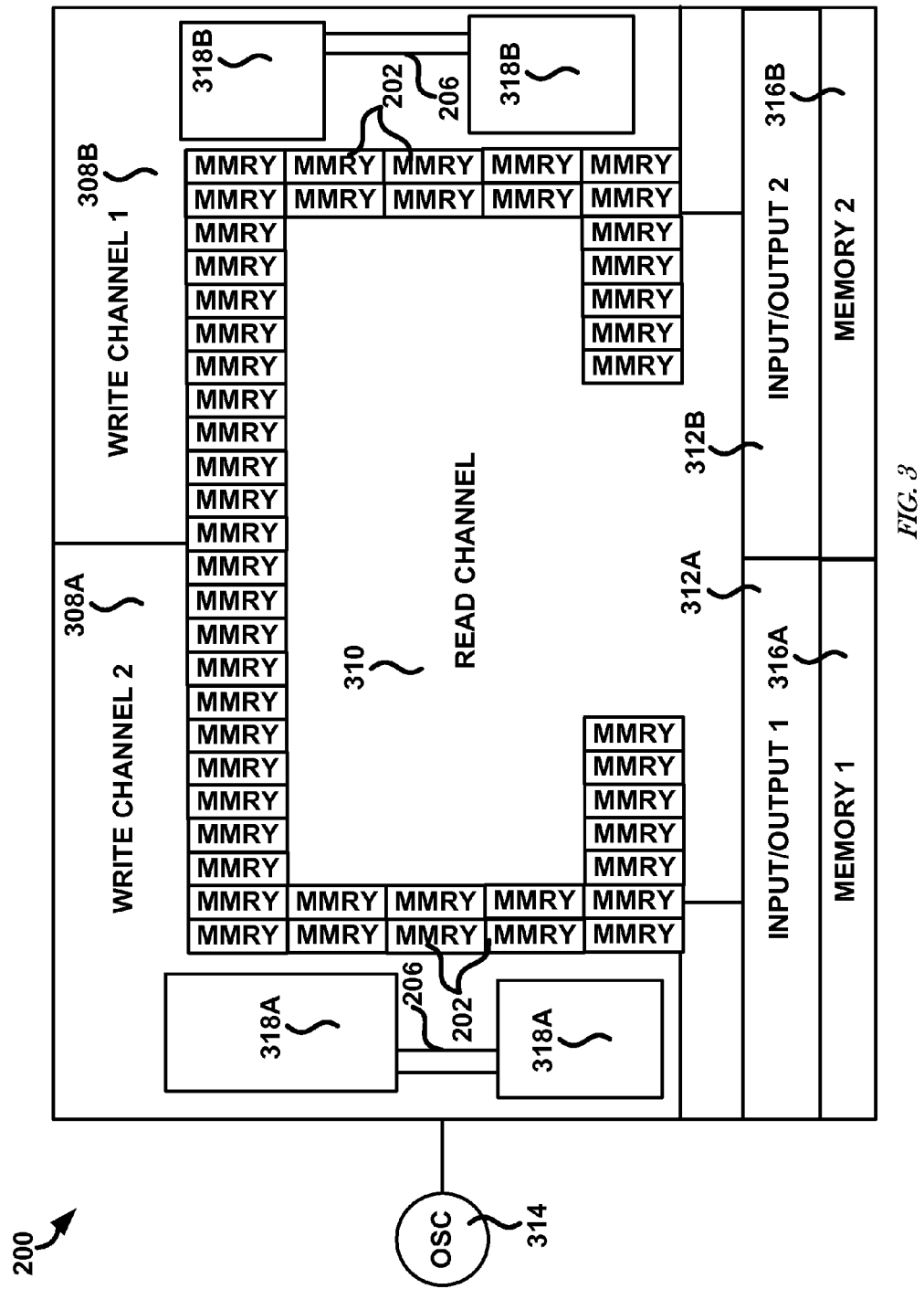
FIG. 3 shows a block diagram of an example of a memory package.

FIG. 3 shows an example of the circuit 200 of FIG. 2 with the read channel 310 and write channels 308A and 308B of memories 316A and 316B, respectively, shown in FIG. 3. The circuit 200 can include the ring-like configuration of memory units 202, the memory write channels 308A or 308B, the memory read channel 310, memory I/O circuitry 312A or 312B, or a clock 314 (e.g., oscillator). The combinational logic 204 can be situated principally within the ring-like configuration of memory units 202, however the combinational logic 104 is not shown in FIG. 3 for convenience of showing where the read channel 310 can be located. The combinational logic 204 (e.g., the circuitry used to implement the logic of the LDPC) can be a sub-module of the read channel 310. The memory units 202, memory write channel 308A-B, memory read channel 310, I/O circuitry 312A-B, or clock 314 can be electrically coupled to one another through one or more interconnects 206 (not shown in FIG. 3). The memory read channel 310 and one of the memory write channels 308A or 308B can collectively be considered a memory channel of the memory 316A-B.

The clock 314 can oscillate at a frequency of between about 200 and about 600 Megahertz (MHz). In one or more embodiments, the clock 314 can oscillate at about 225 MHz. The maximum frequency of the clock 314 can be a function of a signal latency in an interconnect 206 or the technology used to produce the memory unit 202 or the combinational logic 204. For example, by reducing the length of the interconnect 206 or reducing the size of the wavelength of the light source used to cure photoresist in making the circuit 200 (e.g., reducing the spacing between components on a silicon die of the circuit 200), the maximum clock frequency can be increased. By including the ring-like configuration of memory units 202, the increase in the maximum speed of the clock 314 can be increased by about 25 percent over the maximum speed of a clock of the circuit 100.

Two or more memories 316A or 316B (not to be confused with a memory unit 202 of the LPDC) can share the LDPC, such as by being coupled to the LDPC circuit 200, such as through the Input/Output (I/O) circuitry 312A or 312B. The two memories 316A-B can share the same read channel 310 while still maintaining independent, dedicated write channels 308A and 308B, such as shown in FIG. 3. Savings of about ten percent area can be realized by using a shared read channel 310. The reduction in area can reduce interconnect 206 length, lower time latency, and increase the speed of the LDPC to memory 316A-B throughput.

In an embodiment where the circuit 200 includes two memory channels (e.g., in a configuration where the package 300 is configured to allow the two memories 316A and 316B to be coupled to the LDPC circuit 200 simultaneously), such as shown in FIG. 3, the two memories 316A and 316B can each have dedicated, individual write channels 308A or 308B, respectively, or I/O circuitry 312A or 312B, respectively.

The read channel 310 and combinational logic 204 can share the area 210 (see FIG. 2) that is within the ring-like configuration of memory units 202. The read channel 310 can be situated principally within the ring-like configuration of memory units 202. The read channel 310 can be situated or arranged at least partially outside the ring-like configuration of memory units 202, such as to be situated, at least in part, between the I/O circuitry 312A-B and a portion of an outside portion of the ring-like configuration of memory units 202, such as shown in FIG. 3.

The write channels 308A-B can be situated (e.g., principally or at least partially) outside the ring-like configuration of memory units 202. The write channels 308A-B can be situated between an outside periphery of the ring-like configuration of memory units 202 and a periphery of the package or substrate in or on which the write channels 308A-B are situated, such as shown in FIG. 3. The write channel 308A can be situated primarily outside the ring-like configuration of memory units 202 so as to adjacent to or non-overlapping with the write channel 308B that can likewise be situated primarily outside the ring-like configuration of memory units 202, such as shown in FIGS. 3, 4A, and 4B.

The write channels 308A-B can include sequential or combinational logic 318A or 318B, respectively. The logic 318A-B can implement an error correction code (e.g., an LDPC, block error correcting code, convolutional error correcting code, turbo code, a combination thereof, variations thereof, or other error correction code), so as to help determine if the data being written to the memory 316A-B is correct. The logic 318A-B can include a flip flop, sequential logic, multiplexer, or combinational logic (e.g., such as logic similar to the combinational logic 204). The write channels 308A-B can be configured to transfer data to the memory 316A-B. The read channel 310 can be configured to transfer data from the memory 316A-B. The read channel 310 can use the LDPC, such as to provide an error correction code mechanism in performing a read.

Any of the examples of LDPC circuits 200 can be implemented in a Solid State Device (e.g., flash) controller. The memories 316A-B coupled to the LDPC read channel 310 and write channels 308A and 308B can be flash memories.

Figures 4A, 4B:
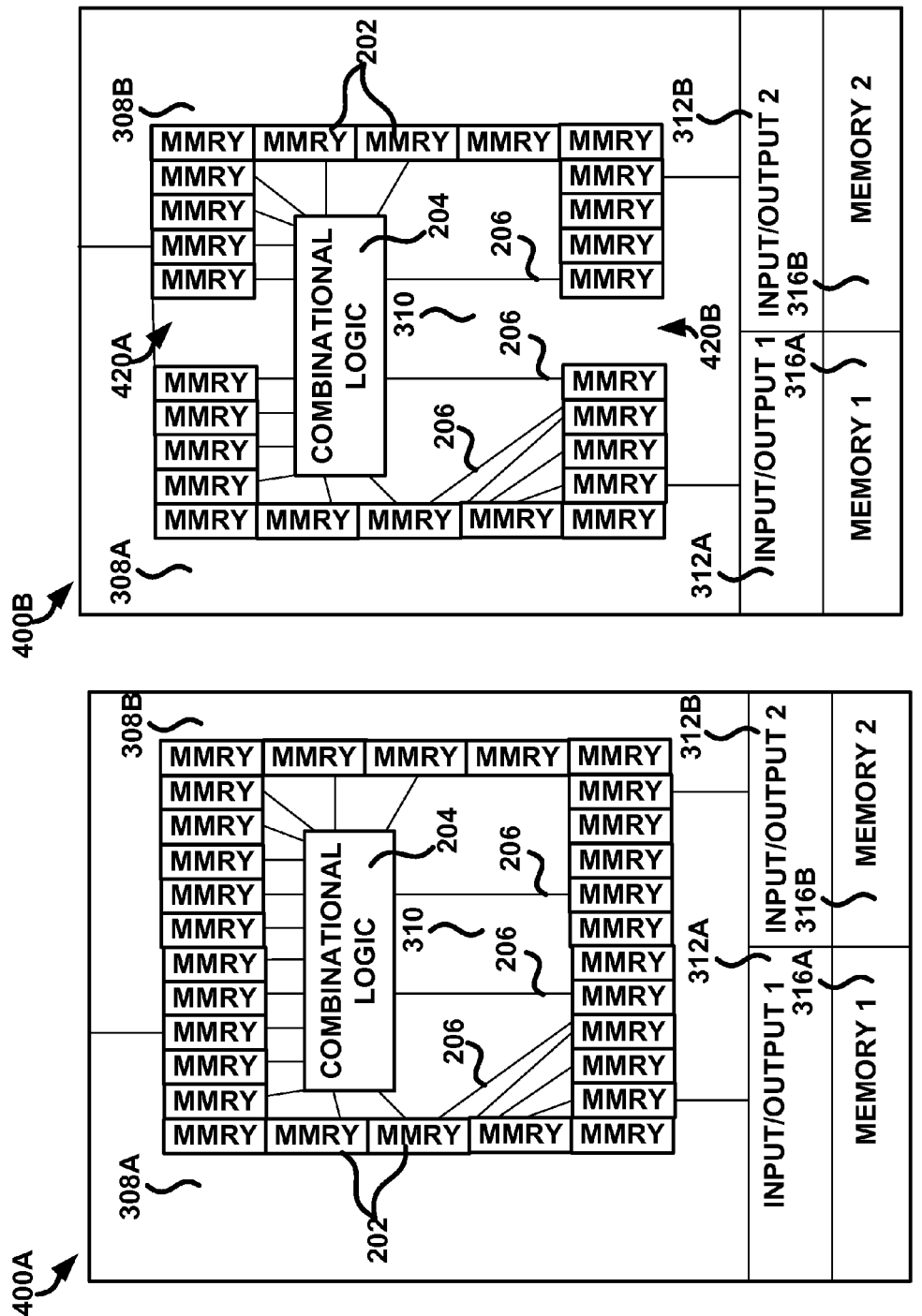
FIG. 4A and FIG. 4B show block diagrams of examples of ring-like configurations of memory units.

FIGS. 4A and 4B show examples of circuits 400A and 400B with ring-like configurations of memory units 102. The circuit 400A includes a closed ring configuration of memory units 202. In this configuration, at least some of the memory units 202 can be spaced apart such that one or more interconnects 206 can be situated between the memory units 202.

The circuit 400B includes an open-ring configuration of memory units 102 with two openings 420A and 420B in the open-ring configuration of memory units 202. Other ring-like configurations of memory units can be used such as open-ring configurations with narrower, wider, more, or fewer openings in the ring-like configuration of memory units 202. For example, a ring-like configuration of memory units 202 can include three or more openings between the memory units 202.

Figure 5:
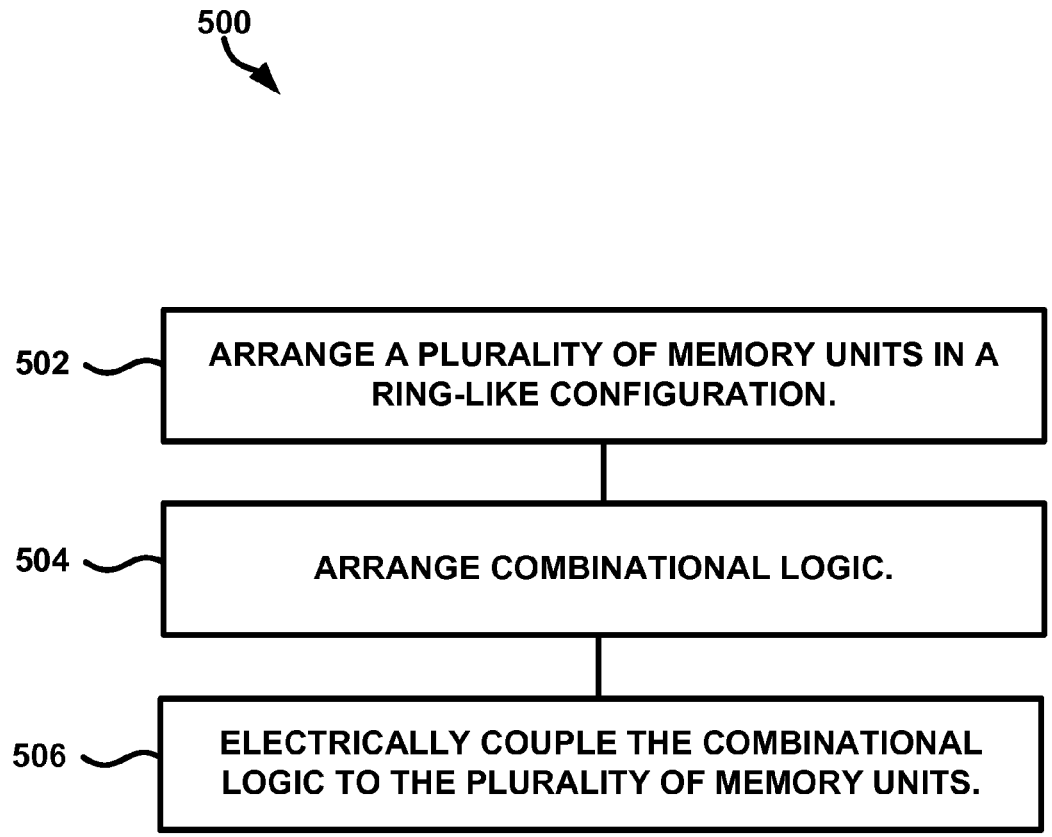
FIG. 5 shows a flow diagram of an example technique.

FIG. 5 shows a block diagram of a technique 500 for making a circuit that includes an LDPC circuit. At 502, a plurality of memory units can be arranged in a ring-like configuration. Each of the memory units can be RAM memory units. At 504, combinational logic can be provided or arranged. The combinational logic can be arranged, such as to be situated principally inside the ring-like configuration of memory units. At 506, the combinational logic can be electrically coupled to the plurality of memory units. Each of the memory units of the plurality of memory units can be electrically coupled to all the other memory units of the plurality of memory units.

The technique 500 can include providing a clock configured to oscillate at a frequency in a range of between about two hundred to about six hundred Megahertz (MHz). In one or more embodiments, the clock can oscillate at a frequency of about 225 MHz. The technique 500 can include electrically coupling the clock to the plurality of memory units or the combinational logic.

In general, it is undesirable to implement an SoC design that takes up a lot of area in the middle of the chip (e.g., package). This is because the routing can be forced to include longer interconnects so as to travel around the middle of the chip. Most layouts that include circuits in the center of the die will likely have longer routing paths and likely have congestion problems getting around the middle of the die to the other side of the die. However, given the functional behavior of the LDPC, arranging or placing both the memory units and combinational logic as much in the center of the chip as possible (e.g., as shown in FIG. 2) can give both memory units and combinational logic access to each other using shorter interconnects, thus decreasing the latency associated with signals carried by the interconnects and increasing the rate at which the LDPC circuit can be reliably operated and increasing throughput. Using the concept of circles, which are inherently not common in square IC (e.g., SoC) designs, shorter interconnect lengths and higher throughput can be realized, as compared to prior solutions.

The above description and the drawings illustrate some embodiments to enable those skilled in the art to practice the embodiments of the invention. Other embodiments may incorporate structural, logical, electrical, process, and other changes. Examples merely typify possible variations. Portions and features of some embodiments may be included in, or substituted for, those of other embodiments. Many other embodiments will be apparent to those of skill in the art upon reading and understanding the above description.

What is claimed is:

1. A Low Density Parity Check (LDPC) System on Chip (SoC) package comprising:
   a first memory channel and a second memory channel, the first memory channel including a first dedicated write memory channel, the second memory channel including a second dedicated write memory channel;
   a read memory channel shared by the first memory channel and the second memory channel;
   a Low Density Parity Check (LDPC) circuit coupled to the first and second memory channels, the LDPC comprising:
      combinational logic; and
   a plurality of memory units electrically coupled to the combinational logic and each other,
      wherein the plurality of memory units are situated in an open-annulus configuration, wherein the combinational logical is principally located inside the open-annulus configuration, wherein the first and second write channels are situated principally outside a periphery of the open-annulus configuration, and wherein the read channel is situated principally within the open-annulus configuration and partially outside the open-annulus configuration of memory units, and
      wherein the first memory channel is situated principally outside a first portion of the open-annulus configuration and the second memory channel is situated principally outside a second portion of the open-annulus configuration, and wherein the second portion of the open-annulus configuration is adjacent to and non-overlapping with the first portion of the open-annulus configuration, and wherein the read channel is partially situated in space between memory units in the open-annulus configuration and extends through the space to be partially situated outside the periphery of the open-annulus configuration of memory units.

2. The SoC package of claim 1, further comprising first and second memory channel Input/Output circuitry.

3. The SoC package of claim 1, wherein the first and second memory channels are flash memory channels.

4. The SoC package of claim 1, further comprising a clock coupled to each of the plurality of memory units, wherein the clock is configured to oscillate at about between two hundred and about six hundred megahertz.

5. The SoC package of claim 4, wherein the clock is configured to oscillate at around two hundred twenty-five megahertz.

6. A method of making a Low Density Parity Check (LDPC) Integrated Circuit (IC) comprising:
   arranging a plurality of memory units in an open-annulus configuration;
   arranging combinational logic principally within the open-annulus configuration of memory units;
   electrically coupling the combinational logic to the plurality of memory units and electrically coupling each of the memory units of the plurality of memory units to all the other memory units of the plurality of memory units;
   arranging a first memory channel and a second memory channel around the open-annulus configuration of memory units, including arranging a first memory write channel of the first memory channel and a second memory write channel of the second memory channel principally outside a periphery of the open-ring configuration of memory units, wherein the first memory channel is situated principally outside a first portion of the open-annulus configuration and the second memory channel is situated principally outside a second portion of the open-annulus configuration, and wherein the second portion of the open-annulus configuration is adjacent to and non-overlapping with the first portion of the open-annulus configuration; and arranging a read channel shared by the first and second memory channels principally within the open-annulus configuration, partly in an open space between memory units of the open-annulus configuration, and extending through the space outside a periphery of the open ring configuration of memory units through the open area.

7. The method of claim 6, further comprising electrically coupling the read channel and the first and second write channels to the combinational logic.

8. The method of claim 6, further comprising arranging first and second memory channel Input/Output (I/O) circuitry outside the periphery of the ring-like configuration, the I/O circuitry configured to electrically couple a first memory to the first write channel and the read channel and the I/O circuitry configured to electrically couple a second memory to the second write channel and the read channel when the first and second memories are coupled to the I/O circuitry.

9. The method of claim 6, wherein arranging the plurality of memory units includes situating the memory units generally around the center of the IC, and wherein arranging the combinational logic includes situating the combinational logic generally in the center of the IC.

\* \* \* \* \*